United States Patent [19]

Hollstein et al.

[11] Patent Number: 4,804,861

[45] Date of Patent: Feb. 14, 1989

[54] MULTIFUNCTION ONBOARD INPUT/OUTPUT TERMINATION

[75] Inventors: Roger L. Hollstein, Phoenix; Barry Siegwart, Tempe, both of Ariz.

[73] Assignee: Motorola, Inc., Schaumburg, Ill.

[21] Appl. No.: 154,717

[22] Filed: Feb. 11, 1988

[51] Int. Cl.⁴ .................. H03K 19/092; H03K 19/086; H03K 19/003; H03K 3/013

[52] U.S. Cl. .................... 307/455; 307/454; 307/355

[58] Field of Search ............... 307/454, 455, 456, 457, 307/458, 443, 542, 270, 254, 355, 362, 363, 296.4, 296.6

[56] References Cited

U.S. PATENT DOCUMENTS

| | | | |
|---|---|---|---|
| 4,703,198 | 10/1987 | Porter et al. | 307/443 X |
| 4,751,404 | 6/1988 | Yuen | 307/455 X |
| 4,755,693 | 7/1988 | Suzuki et al. | 307/443 X |
| 4,760,292 | 7/1988 | Bach | 307/443 X |
| 4,771,190 | 9/1988 | Umeki | 307/455 |
| 4,777,391 | 10/1988 | Shin | 307/443 X |

*Primary Examiner*—Stanley D. Miller
*Assistant Examiner*—David R. Bertelson
*Attorney, Agent, or Firm*—William E. Koch

[57] ABSTRACT

An onboard structure used to terminate standard ECL devices of non-gate array devices which save space on the multichip module by requiring only non-discrete components. These non-discrete components include a first transistor having its collector coupled to the emitter of a second transistor, and its based coupled to the collector of a third transistor. Different variations of the onboard structure permit the structure to be a 50 ohm output, a 25 ohm output, a 60 ohm output, a series terminated output or a current sourced input termination.

6 Claims, 1 Drawing Sheet

MULTIFUNCTION ONBOARD INPUT/OUTPUT TERMINATION

BACKGROUND OF THE INVENTION

This invention pertains generally to the termination of standard memory devices used in multichip applications.

As a memory system becomes more complex it has become necessary to utilize non-gate array devices on high density multichip modules. The space available in multichip usage is becoming increasingly smaller as more and more devices are needed. Unfortunately, prior art devices required that termination of a standard ECL output of non-gate array devices had to be achieved by a discrete resistor mounted on the multichip substrate and, thus, separate from the integrated circuit device.

While the addition of a single discrete resistor may pose no overcrowding concerns on a multichip module, when multiplied by the number of ECL outputs of the non-gate array devices in more complex applications, the density of the package rapdily becomes burdensome.

SUMMARY OF THE INVENTION

It is an object of the present invention to provide a termination for standard ECL outputs of non-gate array devices which eliminates the need for discrete components.

It is an additional object of the present invention to provide a current source onboard termination which allows for programmability of the current source value.

These and other objects and advantages of the present invention are achieved by two similar transistor networks which permit the elimination of discrete resistors mounted separately from the integrated circuit device. The first transistor network creates an onboard series termination output for a memory device. The second transistor network creates a current sourced input termination.

The objects and advantages described above will become apparent to those skilled in the art upon consideration of the accompanying specification, claims and drawings.

BRIEF DESCRIPTION OF THE DRAWINGS

Referring to the drawings wherein like characters indicate like parts throughout the figures.

DESCRIPTION OF THE PREFERRED EMBODIMENT

Figure 1:
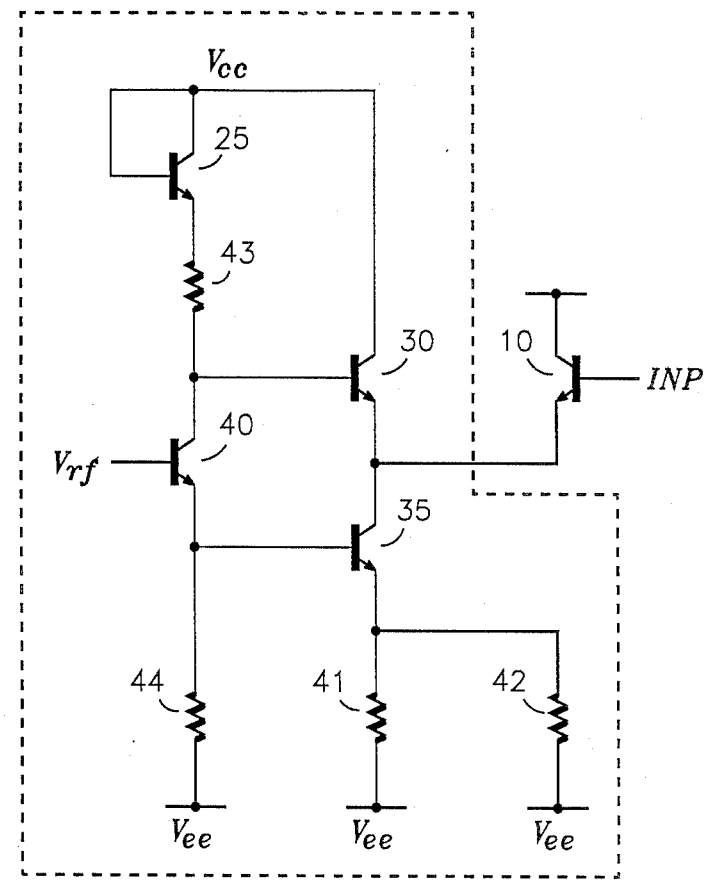
FIG. 1 is an electrical circuit diagram illustrating the present invention in the form of an onboard termination.

Referring specifically to FIG. 1, a transistor 10 which represents the output of another ECL device drives an input node 12 of onboard termination circuit 20. The main components of onboard termination circuit 20 are transistors 25, 30, 35, and 40, and resistors 41, 42, 43, and 44. The collector of transistor 35 is connected to the emitter of transistor 30 and forms input node 12. The interconnection between transistor 30 and transistor 35 is that of a common emitter follower output where the output is transmitted through the emitter of transistor 35 resulting in the desired current flow through resistors 41 and 42.

Transistor 40 of onboard termination circuit 20 has its emitter coupled to both the base of transistor 35 and resistor 44. The collector of transistor 40 is coupled to both the base of transistor 30 and resistor 43. Optional transistor 25, connected so as to act as a diode, has its emitter coupled to resistor 43.

A supply voltage $V_{cc}$ is applied to the base and collector of optional transistor 25 and also to the collector of transistor 30. A reference voltage $V_{rf}$ is supplied to the base of transistor 40.

Through the use of predefined cells, resistors 41 and 42 are tied to the emitter of transistor 35 to program a desired output current. It should be apparent to those skilled in the art that this current is typically 6–10 mA. A supply voltage $V_{ee}$ is applied to resistors 41 and 42, as well as resistor 44. This helps create a bias for transistors 35 and 40. It should also be apparent to those skilled in the art that while two resistors have been shown at the output emanating from the emitter of transistor 35, a single resistor may be utilized in certain applications.

When transistor 10 is on and conducting current to input node 12, transistor 30 is off and the current flowing through the emitter of transistor 10 flows through the emitter of transistor 35 resulting in the desired output through resistors 41 and 42.

When transistor 10 is off and no current flows to input node 12 from transistor 10, transistor 30 is turned on and the current flowing through the emitter of transistor 35 is supplied by transistor 30. The propagation delay of transistor 30 is minimized by connecting the base of transistor 30 to the collector of transistor 40. By utilizing transistor 30 in such a manner when transistor 10 is off, transistor 35 is unable to drain current from transistor 40. If current was drawn from transistor 40, this would affect reference voltage $V_{rf}$ by increasing the current drawn through the base of transistor 40. This, in turn, would result in inefficient operation of onboard circuit 20 since reference voltage $V_{rf}$ may be used elsewhere on the chip and needs to remain constant.

Thus, FIG. 1 displays an onboard current source input termination which saves space by eliminating the requirement of a discrete termination resistor.

Figure 2:
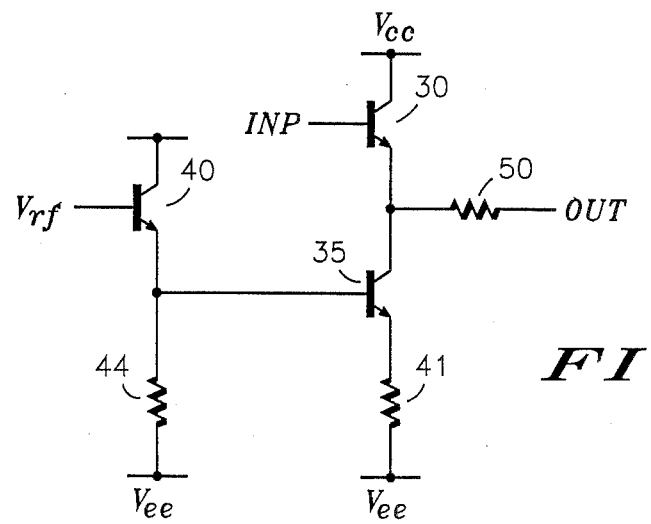
FIG. 2 is an electrical circuit diagram illustrating the present invention in a form where the circuit acts as an output which can be series terminated by a resistor.

Another variation of the present invention is illustrated in FIG. 2. In this application, the base of transistor 30 is connected to the output of an output macro cell array (not shown). Transistors 30, 35, and 40 are connected similar to FIG. 1 with the exception that the collector of transistor 40 is no longer coupled to the base of transistor 30. Also, resistor 42 of FIG. 1 has been eliminated in FIG. 2. Since the base of transistor 30 now acting as an input, input node 12 now actually becomes an output which can be series terminated by the addition of resistor 50. Resistor 50 can be a predefined cell of various resistance values which allows the current source to be programmable.

Thus, FIG. 2 displays a series terminated output which once again eliminates the need for discrete components mounted separately from the device.

While two specific embodiments of this invention have been shown and described, further modifications and improvements will occur to those skilled in the art. For example, with the use of only transistors 30 and 35 tied in parallel, which creates a common 50 ohm ECL emitter follower output, the selection of the output macro device can be varied to allow for a 60 ohm output or a 25 ohm output. These variations are achieved with no discrete components. We desire it to be understood, therefore, that this invention is not limited to the particular form shown and we intend to cover all modifications which do not depart from the spirit and scope of this invention.

We claim:

1. An onboard current sourced termination used to terminate a standard ECL output comprising:
    a first transistor having a base, an emitter, and a collector;
    a second transistor having a base, an emitter and a collector wherein said collector of said second transistor is coupled to said emitter of said first transistor to form an input node;
    a third transistor having a base, an emitter and a collector, said collector of said third transistor coupled to said base of said first transistor and said emitter of said third transistor coupled to said base of said second transistor and said base of said third transistor capable of receiving a reference voltage supply;
    a first resistor having first and second ends, said first end of said first resistor coupled to said collector of said first transistor and said second end coupled between said base of said first transistor and said collector of said third transistor; and
    a predefined resistance cell tied to said emitter of said second transistor.

2. An onboard current sourced termination as recited in claim 1 additionally comprising:
    a fourth transistor having a base, and emitter and a collector wherein said base and said collector are connected to each other and coupled to said collector of said first transistor, and said emitter of said fourth transistor is coupled to said first end of said resistor.

3. An onboard current sourced to termination as recited in claim 1 further comprising a second resistor having first and second ends, said first end of said second resistor coupled between said base of said second transistor and said emitter of said third transistor, and said second end of said second resistor coupled to a bias voltage.

4. A series terminated output for a macro cell device comprising:
    a first transistor having a base, an emitter, and a collector;
    a second transistor having a base, an emitter, and a collector, said collector of said second transistor is connected to said emitter of said first transistor to form a common node;
    a third transistor having a base, an emitter, and a collector wherein said emitter of said third transistor is connected to said base of said second transistor; and
    a non-discrete resistance cell attached to said common node to series terminate said emitter of said first transistor.

5. A series terminated output for a macro cell device as recited in claim 4 wherein said base of said first transistor receives the output of said macro cell device to be series terminated.

6. A series terminated output for a macro cell device as recited in claim 4 additionally comprising:
    a resistor having first and second ends, said first end of said resistor coupled between said base of said second transistor and said emitter of said third transistor, and said second end of said resistor coupled to a bias voltage.

* * * * *